United States Patent [19]

Roberts et al.

[11] Patent Number: 4,970,573
[45] Date of Patent: Nov. 13, 1990

[54] SELF-PLANARIZED GOLD INTERCONNECT LAYER

[75] Inventors: Bruce E. Roberts; Jimmy C. Black, both of Palm Bay; George E. Mraz, Fellsmere, all of Fla.

[73] Assignee: Harris Corporation, Melbourne, Fla.

[21] Appl. No.: 181,718

[22] Filed: Apr. 14, 1988

Related U.S. Application Data

[62] Division of Ser. No. 881,001, Jul. 1, 1986, abandoned.

[51] Int. Cl.$^5$ .................. G01L 23/54; G01L 21/283
[52] U.S. Cl. .................................... 357/71; 357/54
[58] Field of Search ................ 357/71, 68, 54, 67; 437/193, 194, 195, 189

[56] References Cited

U.S. PATENT DOCUMENTS

| | | | |
|---|---|---|---|
| 4,398,341 | 8/1983 | Geipel, Jr. et al. | 437/193 |
| 4,728,627 | 3/1988 | Mase et al. | 437/190 |
| 4,771,071 | 9/1988 | Tobin et al. | 437/194 |
| 4,851,369 | 7/1989 | Ellwanger et al. | 437/189 |

Primary Examiner—Rolf Hille
Assistant Examiner—S. V. Clark
Attorney, Agent, or Firm—Evenson, Wands, Edwards, Lenahan & McKeown

[57] ABSTRACT

Formation of an interconnect structure having a self-planarized dielectric layer between successive layers of metallization is accomplished by conformally depositing a dielectric layer over the entire structure (including underlying regions and contact base metallization) to which the interconnect pattern is to be plated. Atop the dielectric layer a sacrificial layer is conformally deposited. Thereafter apertures are etched through both the sacrificial and dielectric layers in accordance with a prescribed interconnect plating pattern that has been photolithographically mapped onto the laminate structure. The aspect ratios of the apertures through the laminate are such that metal to be subsequently deposited therethrough is confined to the exposed surface area of the underlying topography but not on the sidewalls of the apertures through the dielectric layer. The sacrificial layers (and overlying metal plate) are then removed leaving only the patterned conformed dielectric layer and the deposited metal. The main body portion of the interconnect structure is now plated onto the deposited metal pattern to a thickness in the apertures of the dielectric which is slightly below the top surface of the dielectric layer. Thereafter, a second, thin dielectric layer is non-selectively conformally deposited over the entire structure. Contact vias for a second layer of metal to be formed over the top surface of the second dielectric layer are selectively etched through this second dielectric layer to expose surface portions of the underlying plated metal.

2 Claims, 2 Drawing Sheets

SELF-PLANARIZED GOLD INTERCONNECT LAYER

FIELD OF THE INVENTION

This is a division of application Ser. No. 881,001, filed July 1, 1986, now abandoned.

The present invention relates, in general, to semiconductor devices and is particularly directed to a technique for forming gold interconnect lines while providing planarization of dielectric layers through which interconnect contacts are provided.

BACKGROUND OF THE INVENTION

With the continuing development of integrated circuits having higher integration densities (with reduced minimum feature geometries) and signal processing speeds, the structure of interconnect lines by way of which signal paths for both intra chip and inter chip connections are provided has become increasingly complex and, consequentially, configuration critical. In high performance environments, such as very high speed integrated circuits, where dimension tolerances are extremely tight, planarization of respective interconnect line/dielectric layers constitutes a significant structual criterion for ensuring good step coverage between successive levels of interconnect media.

Conventionally, an interconnect laminate structure is formed by depositing a seed (e.g. gold-based) layer upon which an interconnect metal (e.g. gold) layer may be selectively (electro) plated using a patterned layer of photoresist formed on the seed metal layer. The photoresist layer is then stripped off and the seed layer is etched away to leave a prescribed base level metallization pattern. Because the etchant which removes the seed layer also partially removes the plated metal, the latter must be somewhat overplated to accommodate for the slight loss. A relatively thick (e.g. 10K–20KÅ) layer of dielectric, (e.g. oxide) over which a second level of interconnect is to be provided, is formed over the selectively plated base metal structure. Complete encapsulation of all metal lines of small ($\leq 2\mu$m) spacing is difficult to achieve. A layer of photoresist, patterned to define a contact aperture layout through the dielectric layer to the underlying plated metal pattern, is next formed atop the dielectric layer. The dielectric is then partially etched using the patterned photoresist layer as a mask, to initiate the formation of contact vias to the underlying plated structure. After vias have been partially etched in the top surface of the dielectric layer, the photoresist is removed to expose the entire surface of the dielectric to the etchant. As a result there is a simultaneous decrease in the thickness of previously masked portions of the dielectric and a continuation of the etching of contact vias until the underlying plated metal is reached. At this point the thickness of the dielectric layer is typically on the order of 5KÅ.

Unfortunately, because of the sensitivity of a number of process control parameters and the considerable thickness of the dielectric layer as originally formed, it is difficult to ensure the requisite planarization of the dielectric layer remaining after the above sequence of steps that will afford adequate step coverage of the second metal-to-first (or subsequent consecutive layers) metal in the contact vias of the dielectric. Simply put, the above described process is complicated, entailing additional etching steps and need for the materials that become part of the final structure to have additional thickness to accommodate partial removal during subsequent processing, and does not readily afford good step coverage.

SUMMARY OF THE INVENTION

In accordance with the present invention, there is provided a new and improved process for simplifying the formation of an interconnect structure and facilitating planarization of the dielectric layer between successive layers of metallization. Pursuant to the present invention, rather than form the dielectric layer after plating a base metal layer (which undergoes no further etching, as during removal of unwanted seed material in the above described process), the dielectric layer is deposited conformally over the entire structure (including underlying regions and contact base metallization) to which the interconnect pattern is to be plated. Atop the dielectric layer one or more sacrificial layers are conformally deposited. Thereafter apertures are etched through both the sacrificial and dielectric layers in accordance with a prescribed interconnect plating pattern that has been photolithographically mapped atop the laminate structure. The aspect ratios of the apertures through the laminate are such that metal to be subsequently deposited therethrough is confined to the exposed surface area of the underlying topography and the top surface of the sacrificial layers but not on the sidewalls of the apertures through the dielectric layer. The sacrificial layers (and overlying metal plate) are then removed leaving only the patterned conformed dielectric layer and the deposited metal.

The main body portion of the interconnect structure is now plated onto the deposited metal pattern to a thickness in the apertures of the dielectric which is slightly below the top surface of the dielectric layer. Thereafter, a second, thin dielectric layer is non-selectively conformally deposited over the entire structure. Contact vias for a second layer of metal to be formed over the top surface of the second dielectric layer are selectively etched through this second dielectric layer to expose surface portions of the underlying plated metal.

Because the second dielectric layer is of uniform thickness over the entire substrate, all apertures through this layer have the same effective end point distance from the top surface to plated metal. In effect, therefore, the processing methodology of the present invention is self-planarizing. In addition, because the base metal is deposited after the dielectric is in place, complete (100%) dielectric coverage of the interconnect lines is afforded, while additional etching of the base metal is obviated.

DETAILED DESCRIPTION

Referring now to FIGS. 1–6, the processing methodology of forming a self-planarized interconnect structure will be described.

Figure 1:
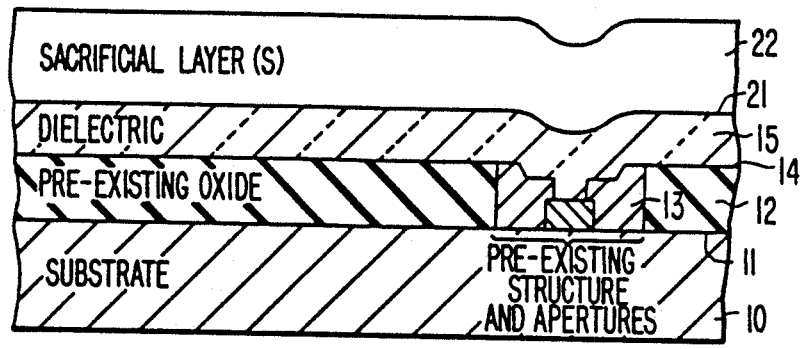
FIGS. 1–6 are sectional views of an interconnect metallization structure for illustrating successive steps in a processing sequence carried out in accordance with the present invention.

As shown in FIG. 1, the semiconductor structure upon which the interconnect laminate (metallization/dielectric) is to be formed comprises a semiconductor (e.g. silicon) substrate 10 in which respective device regions (not shown) are provided. On the surface 11 of substrate 10 is an insulator (e.g. oxide layer) structure and a metallization/conductive (e.g. gold/poly) base layer 13. As described previously, it has been conventional practice to form a seed metal layer over the existing insulator and base metal structure, selectively electroplate onto the seed layer and then etch away the nonplated areas of the seed layer to leave a base contact area. Conventionally, the dielectric layer is formed subsequent to the base metallization layer.

In accordance with the present invention, however, as illustrated in FIG. 1, a dielectric layer 15 is deposited conformly, as through chemical vapor deposition or plasma enhanced chemical vapor deposition, over the entirety of the preexisting topography, including insulator layer 12 and underlying metallization base layer 13. Dielectric (oxide) layer 15 typically has a thickness on the order of 5KÅ–15KÅ. On the top surface 21 of dielectric layer 15 a sacrificial layer (one or more layers) 22 such as silicon nitride, is conformlly deposited. The choice of the constituents of sacrificial layer 22 will depend upon its ease of patterning and etching, and its etch selectivity with respect to dielectric layer 15, in addition to other process compatability parameters. The thickness of sacrificial layer 22 will depend upon the aspect ratio of apertures to be formed therethrough and through the dielectric layer 15 through which a base plating layer is deposited. In effect, the aspect ratio is chosen to insure poor step coverage from the top surface of the sacrificial layer 22 to the bottom of the apertures through the sacrificial layer and underlying dielectric layer 15.

Figure 2:
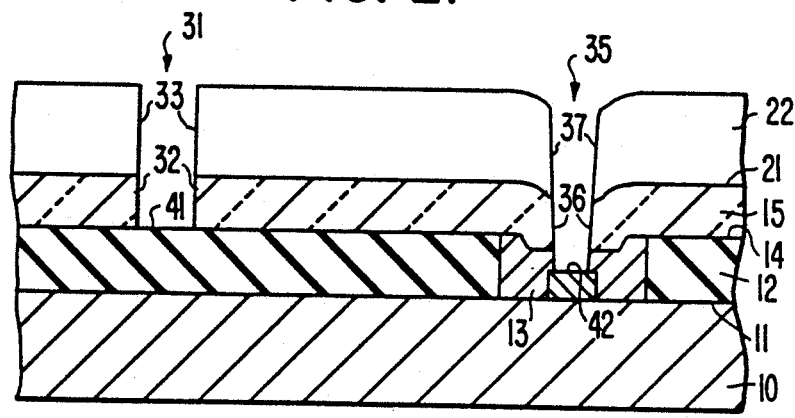
Figure 3:
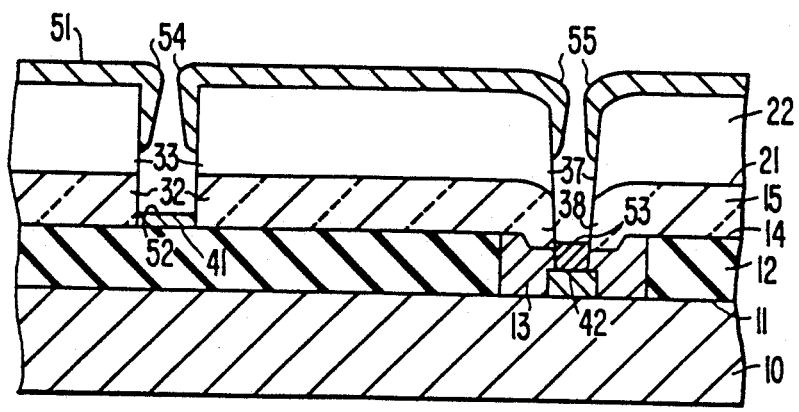

These apertures, shown at 31 and 35 in FIG. 2, are defined by sidewalls 33 and 37 in sacrificial layer 22 and sidewalls 32 and 36 in dielectric layer 15. In the exemplary embodiment illustrated in FIG. 2, a surface portion 41 of preexisting insulator layer layer 12 is exposed by aperture 31 and a surface portion 42 of metallization layer 13 is exposed by aperture 35. Apertures 31 and 35 are formed in sacrificial layer 22 and dielectric layer 15 by conventional photolithographic patterning and etching steps. Once the apertures have been formed, a base contact metal of interest (e.g. gold) is deposited nonselectively over the entire substrate structure shown in FIG. 2 to result in the deposition of a metal layer 51 on the top surface of the sacrificial layer 22 and on top portions of the sidewalls 33 and 37 to leave overhangs 54 and 55 of deposited metal as shown in FIG. 3. Because of the high aspect ratio of apertures 31 and 35, however, no metal is deposited on the sidewalls 32 and 38 of apertures 31 and 35 in dielectric layer 15. Instead, the metal is deposited on the exposed surface portions 41 and 42 of insulator layer 12 and metallization layer 13, respectively, as shown in FIG. 3, leaving deposited metal layers 52 and 53 thereat. The thickness of the deposited metal layers 52 and 53 is typically on the order of only a few KÅ. These deposited base layers 52 and 53 will serve as growth base layers for subsequently plated contacts.

Figure 4:
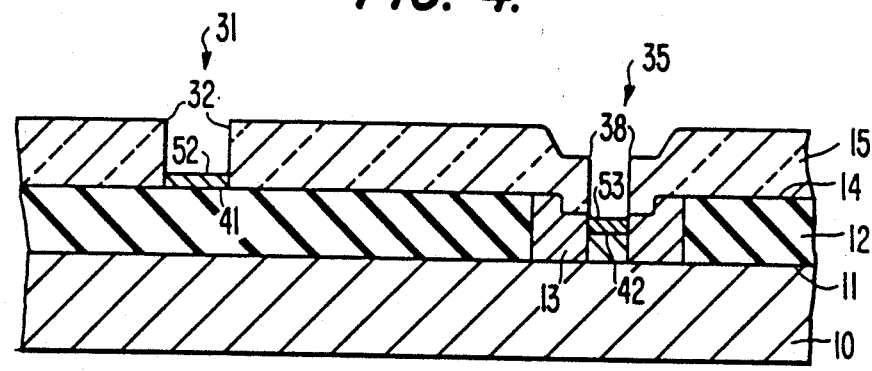

Next, as shown in FIG. 4, sacrificial layer 22 and its overlying deposited metal layer 51 are removed by a conventional dissolving/etching step in a solution such as phosphoric acid, which does not attack the existing dielectric layer 15 nor the deposited metal layers 52 and 53, leaving the structure shown in FIG. 4.

Figure 5:
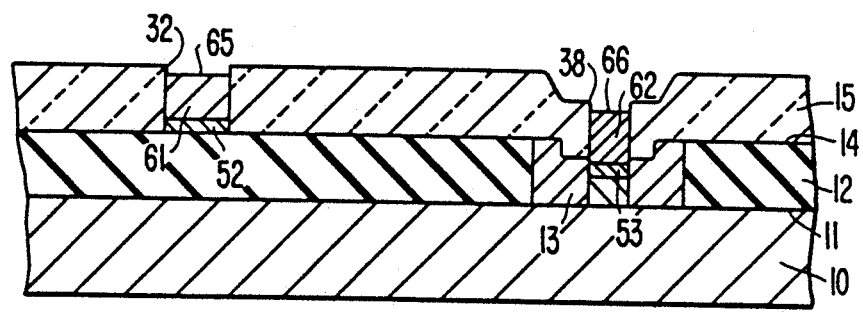

Following this step, as illustrated in FIG. 5, interconnect metal of interest (e.g. gold) is plated up in apertures 31 and 35 in dielectric layer 15 from base metal layers 52 and 53. These plated metal lands 61 and 62 may be formed electrolessly or by electroplating, utilizing a backside contact on substrate 10. The thickness of plated metal regions 61 and 62 is slightly below the top surface 21 of dielectric layer 15, providing 100% coverage on three sides of the metal line by the dielectric layer 15. Where a dielectric layer having a thickness on the order of 5–6KÅ, each of layers 61 and 62 may have a thickness on the order of 4KÅ.

Figure 6:
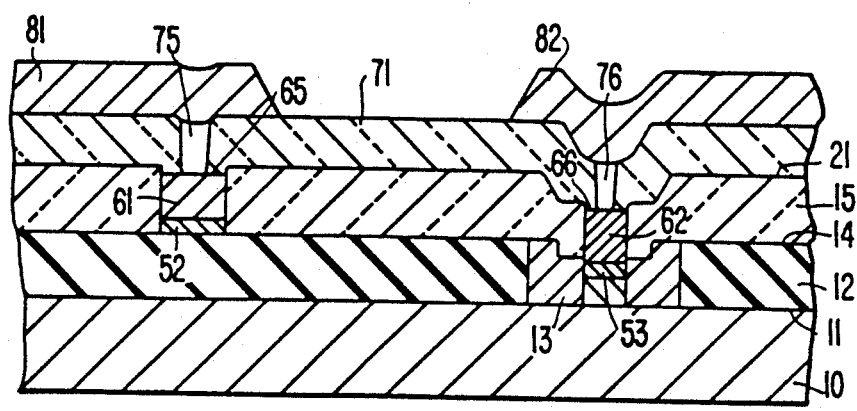

After plating the main body portions 61 and 62 of the interconnect line to be formed over the dielectric layer 15, the entire structure is subjected to a conformal deposition of a relatively thin (on the order of 3,000Å–10,000Å) layer of dielectric 71, on the surface 21 of dielectric layer 15 and the surfaces 65 and 66 of metallization land regions 61 and 62 as shown in FIG. 6. Following the deposition of thin dielectric layer 71, vias or apertures 75, 76 for selective contact to the underlying metallization lands 61 and 62 are formed through layer 71. Since it is through layer 71 that contacts to the underlying metallization are provided, with layer 71 being of uniform thickness over the entire structure, each of the apertures 75 and 76 will have the same end point or equal depths regardless of the location of the aperture. In other words, the structure is self-planarized, providing effectly equal step coverage between an overlying layer of metallization 81, 82, selectively formed on the surface of dielectric layer 71 and the main body portions 61 and 62 of the interconnect through apertures 75 and 76.

As will be appreciated from the foregoing description, through the use of an overlying sacrificial layer and apertures through the sacrificial layer and preexisting dielectric therebeneath which have a high aspect ratio, the interconnect metallization processing technique of the present invention offers a processing methodology that is effectively self-planarizing. Moreover, since the dielectric is in place prior to formation of the base contact metal for overlying interconnect runners, no further etching of the base metal occurs, thereby substantially simplifying what was previously a complicated process.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. An interconnect structure for a semiconductor device comprising:
   a first dielectric layer of substantially uniform thickness conformally disposed over the surface of a semiconductor substrate and having apertures therein extending to prescribed surface portions of said substrate;
   respective conductive layers formed on said prescribed surface portions of said substrate but not effectively on sidewalls of said apertures;
   respective layers of conductive material formed within said apertures and extending from the top surfaces of said conductive layers to a thickness less than the thickness of said first dielectric layer;
   a second dielectric layer of substantially uniform thickness conformally disposed over the surface of said first dielectric layer and the respective layers of conductive material disposed in the apertures therein, said second dielectric layer having apertures therein exposing portions of the top surfaces of said layers of conductive material; and a conductive interconnection layer disposed on the top surface of said second dielectric layer and extending through apertures therein to said exposed portions of the top surface of said layers of conductive material.

2. An interconnect structure according to claim 1, wherein said respective layers of conductive material comprise plated metal layers.

* * * * *